US010209610B2

(12) United States Patent
Katou et al.

(10) Patent No.: US 10,209,610 B2
(45) Date of Patent: Feb. 19, 2019

(54) LASER LIGHT SOURCE MODULE AND SCANNING IMAGE DISPLAY APPARATUS

(71) Applicant: Hitachi-LG Data Storage, Inc., Tokyo (JP)

(72) Inventors: Seiichi Katou, Tokyo (JP); Ayano Otsubo, Tokyo (JP); Tatsuya Yamasaki, Tokyo (JP); Hiroshi Ogasawara, Tokyo (JP); Kenji Watabe, Tokyo (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 284 days.

(21) Appl. No.: 15/106,897

(22) PCT Filed: Jan. 16, 2015

(86) PCT No.: PCT/JP2015/051132
§ 371 (c)(1),
(2) Date: Jun. 21, 2016

(87) PCT Pub. No.: WO2015/115214
PCT Pub. Date: Aug. 6, 2015

(65) Prior Publication Data
US 2016/0342076 A1  Nov. 24, 2016

(30) Foreign Application Priority Data

Jan. 28, 2014  (JP) .................. 2014-013487

(51) Int. Cl.
*G03B 21/20* (2006.01)
*G02B 26/10* (2006.01)
(Continued)

(52) U.S. Cl.
CPC ......... *G03B 21/2033* (2013.01); *G02B 7/008* (2013.01); *G02B 26/10* (2013.01);
(Continued)

(58) Field of Classification Search
CPC .... G03B 21/2083; G03B 21/14; G03B 21/16; G02B 26/10; H04N 5/74; H04N 9/3129;
(Continued)

(56) References Cited

U.S. PATENT DOCUMENTS 3,981,573 A * 9/1976 Schwartz ............... G03B 21/10
                                                            353/15
2003/0095346 A1   5/2003 Nasu et al.
(Continued)

FOREIGN PATENT DOCUMENTS

JP     09-075210 A     3/1997
JP     2000-147277 A   5/2000
(Continued)

OTHER PUBLICATIONS

International Search report of PCT/JP2015/051132 dated Mar. 24, 2015.
Extended European Search Report received in corresponding European Application No. 15743893.8 dated Sep. 1, 2017.

*Primary Examiner* — Steven H Whitesell Gordon
*Assistant Examiner* — Jerry Brooks
(74) *Attorney, Agent, or Firm* — Mattingly & Malur, PC

(57) ABSTRACT

In a laser light source module, a light source disposed on a base with a temperature adjusting element therebetween is covered by an inner cover, and is hermetically sealed by an outer cover. A top plate of the inner cover divides the inside of the outer cover into upper and lower sections and covers the light source from above. Side plates cover the side portions of the light source. Partitioning grid plates are provided in a space between the top plate and the outer cover, the partitioning grid plates dividing the space into multiple spaces.

15 Claims, 12 Drawing Sheets

(51) Int. Cl.
*G03B 21/14* (2006.01)
*H04N 5/74* (2006.01)
*H04N 9/31* (2006.01)
*G03B 21/16* (2006.01)
*G02B 7/00* (2006.01)
*H01S 5/02* (2006.01)
*H01S 5/40* (2006.01)

(52) U.S. Cl.
CPC ............. *G03B 21/14* (2013.01); *G03B 21/16* (2013.01); *H01S 5/02* (2013.01); *H04N 5/74* (2013.01); *H04N 9/3129* (2013.01); *H04N 9/3135* (2013.01); *H04N 9/3144* (2013.01); *H04N 9/3161* (2013.01); *H01S 5/4012* (2013.01); *H01S 5/4093* (2013.01)

(58) Field of Classification Search
CPC ... H04N 9/3135; H04N 9/3144; H04N 9/3161
USPC .......................................................... 353/52
See application file for complete search history.

(56) References Cited

U.S. PATENT DOCUMENTS

| | | |
|---|---|---|
| 2006/0244925 A1 | 11/2006 | Seki et al. |
| 2011/0102751 A1* | 5/2011 | Nishigaki ............ H04N 9/3129 353/85 |
| 2012/0257399 A1 | 10/2012 | Miyamoto |
| 2013/0241971 A1 | 9/2013 | Sekiya et al. |
| 2013/0242265 A1 | 9/2013 | Kato et al. |
| 2013/0265646 A1 | 10/2013 | Sakai |
| 2014/0226133 A1* | 8/2014 | Nishimura ........... H04N 9/3147 353/30 |

FOREIGN PATENT DOCUMENTS

| | | |
|---|---|---|
| JP | 2003-142767 A | 5/2003 |
| JP | 2013-190594 A | 9/2013 |

* cited by examiner

LASER LIGHT SOURCE MODULE AND SCANNING IMAGE DISPLAY APPARATUS

TECHNICAL FIELD

The present invention relates to a laser light source module preferable for image display and a scanning image display apparatus including the laser light source module.

BACKGROUND ART

In recent years, small projectors have been actively developed which are capable of being easily carried and of projecting an image onto a large screen. For example, small projectors connectable to notebook personal computers and projector-incorporating video cameras have been already commercially available. Such a projector aligns laser beams emitted from multiple laser light sources onto one optical axis, and allows repeated scanning of the aligned laser beam in the horizontal direction and in the vertical direction, thereby projecting a desired image onto a screen.

Such a projector is also called a scanning image display apparatus, and is mounted on an automobile because of its easy increase in image brightness. In addition, application of such a projector to a head-up display that projects navigation information onto a windshield has been studied. When mounted on an automobile, the scanning image display apparatus (projector) is required to have performance that can withstand the temperature of a strict environment.

For example, the patent literature 1 discloses an example of a temperature compensation technique with respect to environment temperature, which is applied to an optical wavelength multiplex communication optical module. The optical module has, as its main component, a waveguide chip that is held to a predetermined temperature by a Peltier element, the waveguide chip and the Peltier element being covered by a thermal insulation material to be accommodated in a package. This allows the waveguide chip to be less susceptible to change in outside temperature. As a result, electric power supplied to the Peltier element for temperature control is reduced.

The Patent literature 2 discloses an example of a laser diode cooling technique using thermal shielding in a laser module having a laser diode used for a light source for optical communication signals. In the laser module, the laser diode as a heat source is mounted to a base that is temperature-controlled by a thermo-module (Peltier element), and is enclosed by a thermal shielding material that does not come into contact with an outside package. Thus, in this example, the flow of heat from the environment is reduced by the thermal shielding material. As a result, electric power supplied to the thermo-module for cooling the laser diode is reduced.

CITATION LIST

Patent Literature

Patent Literature 1

Japanese Unexamined Patent Application Publication No. 2000-147277

Patent Literature 2

Japanese Unexamined Patent Application Publication No. 2003-142767

SUMMARY OF INVENTION

Technical Problem

In the example of patent literature 1, a foam thermal insulation material is filled into a space between the component to be thermally shielded and the package. Typically, both of a foam thermal insulation material and a fibrous thermal insulation material are very soft, and are not suitable for being precisely molded into a particular shape, and are difficult to arrange in a particular position with high accuracy. Thus, when the thermal insulation material is arranged so as to slightly press the component to be thermally shielded or is arranged so as not to press the component to be thermally shielded, the thermal insulation material is likely to come into contact with other components in the product assembling process. This leads to component breakage and electronic component short-circuiting, electricity leak, or static damage.

That is, the thermal insulation material, which is soft and is difficult to mold, is difficult to handle, in particular, as a member thermally shielding the electronic component. In other words, the thermal insulation material has poor workability during product assembling.

Patent literature 2 discloses an example in which the laser module is enclosed by the thermal shielding material that is made of metal having high thermal conductivity, the thermal shielding material being cooled by the thermo-module. In this example, a thermal insulation material that is soft and is difficult to mold is not used. The thermal shielding material facilitates molding and obtaining arrangement accuracy, thereby eliminating the poor workability of the thermal insulation material during product assembling. In this case, however, a large air layer is generated between the package and the thermal shielding material, resulting in lowered thermal insulation performance due to the convection of air. As a result, electric power supplied to the thermo-module for cooling is increased.

The present invention has been made in view of the problems of the conventional technique and provides a laser light source module and a scanning image display apparatus, which are capable of having good workability during product assembling, are excellent in thermal insulation performance, and are capable of reducing electric power for cooling.

Solution to Problem

A laser light source module according to the present invention includes a light source emitting a laser beam, abase on which the light source is mounted, an outer cover disposed on the base so as to cover the light source mounted on the base, and an inner cover disposed in a space between the light source and the outer cover and covering the light source, in which the inner cover has partitioning members that extend from the inner cover to come into contact with the inner wall of the outer cover, the partitioning members dividing a space between the inner cover and the outer cover into multiple spaces.

Advantageous Effect of Invention

According to the present invention, there are provided the laser light source module and the scanning image display apparatus, which are capable of having good workability during product assembling, are excellent in thermal insulation performance, and are capable of reducing electric power for cooling.

DESCRIPTION OF EMBODIMENT

Embodiments of the present invention will now be described in detail with reference to the drawings.

First Embodiment

Figure 1:
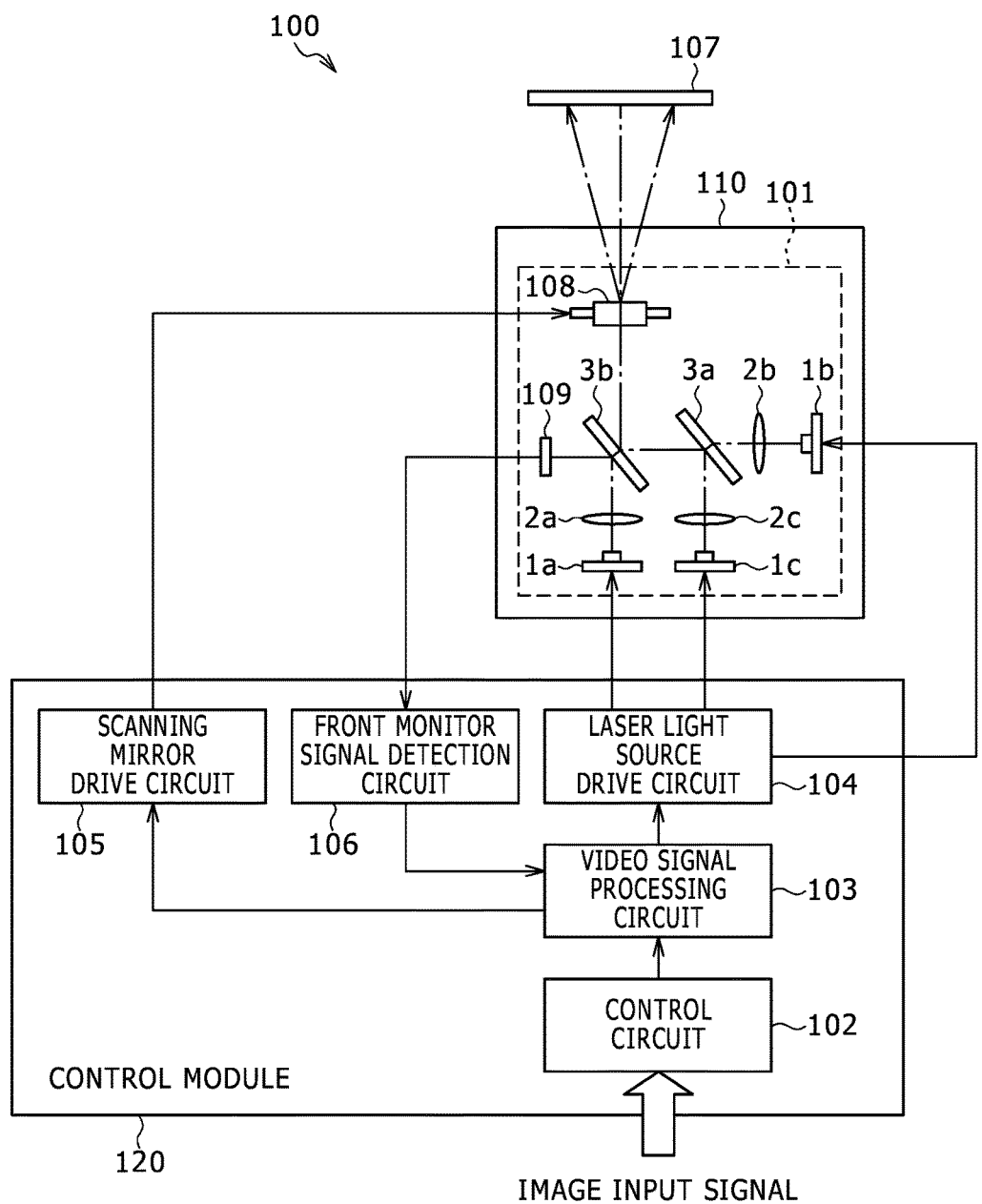
FIG. 1 is a diagram of the functional configuration of a scanning image display apparatus according to a first embodiment of the present invention.

FIG. 1 is a diagram of the functional configuration of a scanning image display apparatus 100 according to a first embodiment of the present invention. As illustrated in FIG. 1, the scanning image display apparatus 100 includes a laser light source module 110 that emits a laser beam for displaying an image onto a screen 107, and a control module 120 that controls a light source 101 included in the laser light source module 110 according to an image input signal inputted from the outside.

The light source 101 included in the laser light source module 110 includes three laser light sources 1a, 1b, and 1c respectively corresponding to three colors of red, green, and blue (hereinafter, R/G/B), three collimator lenses 2a, 2b, and 2c, two beam coupling units 3a, 3b, a scanning mirror 108, and a front monitor 109.

In the light source 101, the collimator lenses 2a, 2b, and 2c allow laser beams emitted from the laser light sources 1a, 1b, and 1c respectively corresponding to the collimator lenses 2a, 2b, and 2c, to be formed into substantially parallel beams. The beam coupling unit 3a aligns and couples the laser beam passing through the collimator lens 2b and the laser beam passing though the collimator lens 2c into a laser beam traveling along one optical axis. In the same manner, the beam coupling unit 3b aligns and couples the laser beam aligned and coupled by the beam coupling unit 3a and the laser beam passing though the collimator lens 2a into a laser beam traveling along one optical axis. Thus, the laser beams emitted from the three laser light sources 1a, 1b, and 1c are aligned and coupled into a laser beam traveling along one optical axis.

The scanning mirror 108 projects the laser beam aligned and coupled by the beam coupling units 3a, 3b onto the screen 107 while being deflected to a predetermined angle. The deflection of the laser beam is carried out such that the end of the beam repeatedly scans the predetermined region of the screen 107, e.g., in the horizontal direction and in the vertical direction. Thus, an image according to the intensity of the R/G/B laser beam emitted from the laser light sources 1a, 1b, and 1c is displayed on the screen 107.

The front monitor 109 is a sensor that detects the laser beam aligned and coupled by the beam coupling units 3a, 3b, and its function will be described later.

Further, as illustrated in FIG. 1, the control module 120 includes a control circuit 102, a video signal processing circuit 103, a laser light source drive circuit 104, a scanning mirror drive circuit 105, and a front monitor signal detection circuit 106.

The control circuit 102 fetches the image input signal inputted from the outside to output the image input signal to the video signal processing circuit 103. The video signal processing circuit 103 subjects the image input signal inputted via the control circuit 102 to a predetermined process, separates the processed signal into R/G/B color signals to output the R/G/B color signals to the laser light source drive circuit 104. Further, the video signal processing circuit 103 extracts a horizontal synchronous signal and a vertical synchronous signal from the inputted image input signal to output the horizontal synchronous signal and the vertical synchronous signal to the scanning mirror drive circuit 105.

The laser light source drive circuit 104 supplies, according to the R/G/B color signals inputted from the video signal processing circuit 103, a luminescence driving current to the laser light sources 1a, 1b, and 1c respectively corresponding to the R/G/B color signals. As a result, the laser light sources 1a, 1b, and 1c emit laser beams having intensity according to the luminescence driving current. As the laser light sources 1a, 1b, and 1c, for example, laser diodes (semiconductor lasers) can be used.

The scanning mirror drive circuit 105 supplies a drive signal that repeatedly tilts a mirror surface in two dimensions, to the scanning mirror 108 in synchronization with the horizontal synchronous signal and the vertical synchronous signal inputted from the video signal processing circuit 103. As a result, the scanning mirror 108 periodically repeatedly tilts the mirror surface by the predetermined angle, reflects the aligned and coupled laser beam by the beam coupling units 3a, and 3b, and projects the laser beam onto the screen 107. At this time, the end of the laser beam repeatedly scans the screen 107 in the horizontal direction and in the vertical direction, thereby displaying an image according to the image input signal on the screen 107.

The front monitor signal detection circuit 106 inputs a signal detected by the front monitor 109, and detects the output levels of the laser beams emitted from the laser light sources 1a, 1b, and 1c. The output levels are inputted to the video signal processing circuit 103. Then, the driving current to the laser light sources 1a, 1b, and 1c is adjusted by the laser light source drive circuit 104. As a result, the output levels of the laser beams emitted from the laser light sources 1a, 1b, and 1c are adjusted so as to provide predetermined proper outputs.

As the scanning mirror 108, a two-axis drive mirror manufactured by micro electromechanical systems (MEMS) technique is preferably used. To drive the scanning mirror 108, any one of piezoelectric, electrostatic, and electromagnetic driving methods may be used.

In addition, as the scanning mirror 108, two one-axis drive mirrors may be prepared and arranged such that laser beams reflected by the two mirrors enable scanning in the direction perpendicular to each other.

Figure 2:
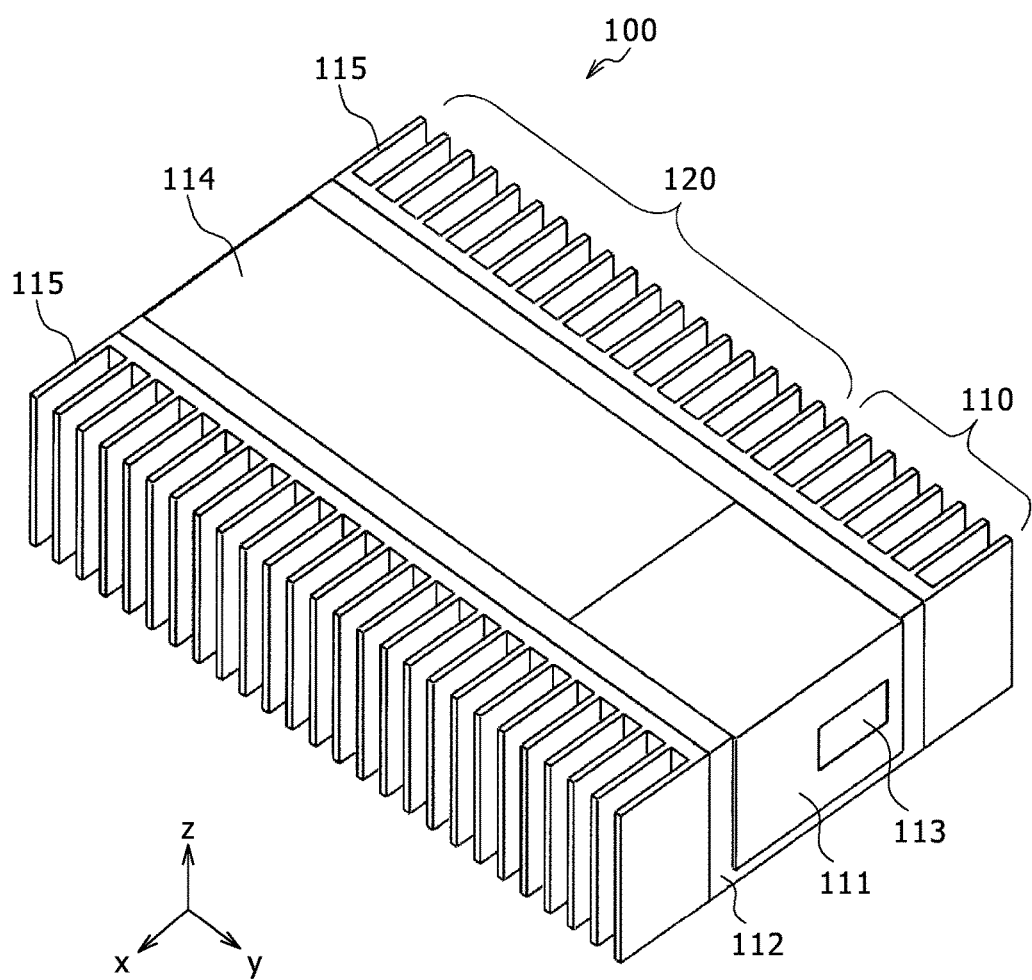
FIG. 2 is an appearance perspective view of the scanning image display apparatus according to the first embodiment of the present invention.

FIG. 2 is an appearance perspective view of the scanning image display apparatus 100 according to the first embodiment of the present invention. As illustrated in FIG. 2, the scanning image display apparatus 100 includes the laser light source module 110 that is a portion covered by an outer cover 111, and the control module 120 that is a portion covered by a protective cover 114. The light source 101 illustrated in FIG. 1 is mounted over a base 112 that is a portion covered by the outer cover 111. In addition, at least one circuit substrate is mounted on the base 112 that is a portion covered by the protective cover 114. On the circuit substrate, there are mounted the control circuit 102, the video signal processing circuit 103, the laser light source drive circuit 104, the front monitor signal detection circuit 106, and the scanning mirror drive circuit 105, which are illustrated in FIG. 1.

The base 112 has a U-shaped groove, which accommodates the laser light source module 110 and the control module 120. Heat sinks 115 for releasing heat are mounted on both sides of the base 112 having a U-shaped groove. In addition, the side faces of the outer cover 111 for the laser light source module 110 and the side faces of the protective cover 114 for the control module 120 are disposed so as to come into contact with the inner walls of the U-shaped groove of the base 112.

The outer cover 111 is disposed so as to come into contact with the upper face of the base 112, the outer cover 111 being hermetically sealed in its inside. The light source 101 is mounted over the base 112 inside the hermetically sealed outer cover 111. A laser emission window 113 is provided on one side face of the outer cover 111. The laser emission window 113 passes the R/G/B laser beam emitted from the light source 101 therethrough. A transparent sealing glass for maintaining air tightness is fitted into the laser emission window 113.

The outer cover 111 is formed of aluminum (Al) having high thermal conductivity. However, the forming material of the outer cover 111 is not limited to aluminum (Al), and may be other materials, such as copper (Cu), having high thermal conductivity. To reflect the processability for processing the outer cover 111 into a desired shape, aluminum (Al) is preferable as the forming material of the outer cover 111.

The protective cover 114 is formed of a zinc steel plate or a cold rolled steel sheet (steel plate cold commercial (SPCC)). The protective cover 114 may be formed of aluminum (Al) having high thermal conductivity, with high heat releasability.

As described above, the heat sinks 115 are mounted on the base 112, and release, to the outside, heat generated from the substrate on which the light source 101 as a heating element (heat source) and the control circuit 102 are mounted. The heat sinks 115 are formed of a material having high thermal conductivity, such as aluminum (Al), and include multiple fins to increase the surface areas thereof. As with the outer cover 111 and the heat sinks 115, the base 112 may be formed of aluminum (Al) having thermal conductivity, with a heat releasing function.

When the temperature of the laser light sources 1a, 1b, and 1c is deviated from the operation guarantee temperature range thereof due to temperature rise during use of the scanning image display apparatus 100, a difference in the luminous sensitivity of the R/G/B color results from the variation in laser wavelength based on temperature dependence. As a result, color shift is caused in an image such that the entire screen becomes reddish. Further, this causes the laser light sources 1a, 1b, and 1c to be lowered in laser output and to be shortened in life.

In addition, the scanning image display apparatus 100 is used as a head-up display mounted on an automobile. In this case, the scanning image display apparatus 100 can be left in a cold region and an extremely hot day, which cause the environment temperature to vary from minus tens of degrees Celsius to near 100 degrees Celsius. Since the environment temperature varies much more greatly than the operation guarantee temperature range of the laser light sources 1a, 1b, and 1c, the light source 101 and the scanning image display apparatus 100 including the same require a heating and cooling mechanism for temperature adjustment to keep the laser light sources 1a, 1b, and 1c within the operation guarantee temperature range thereof.

Figure 3:
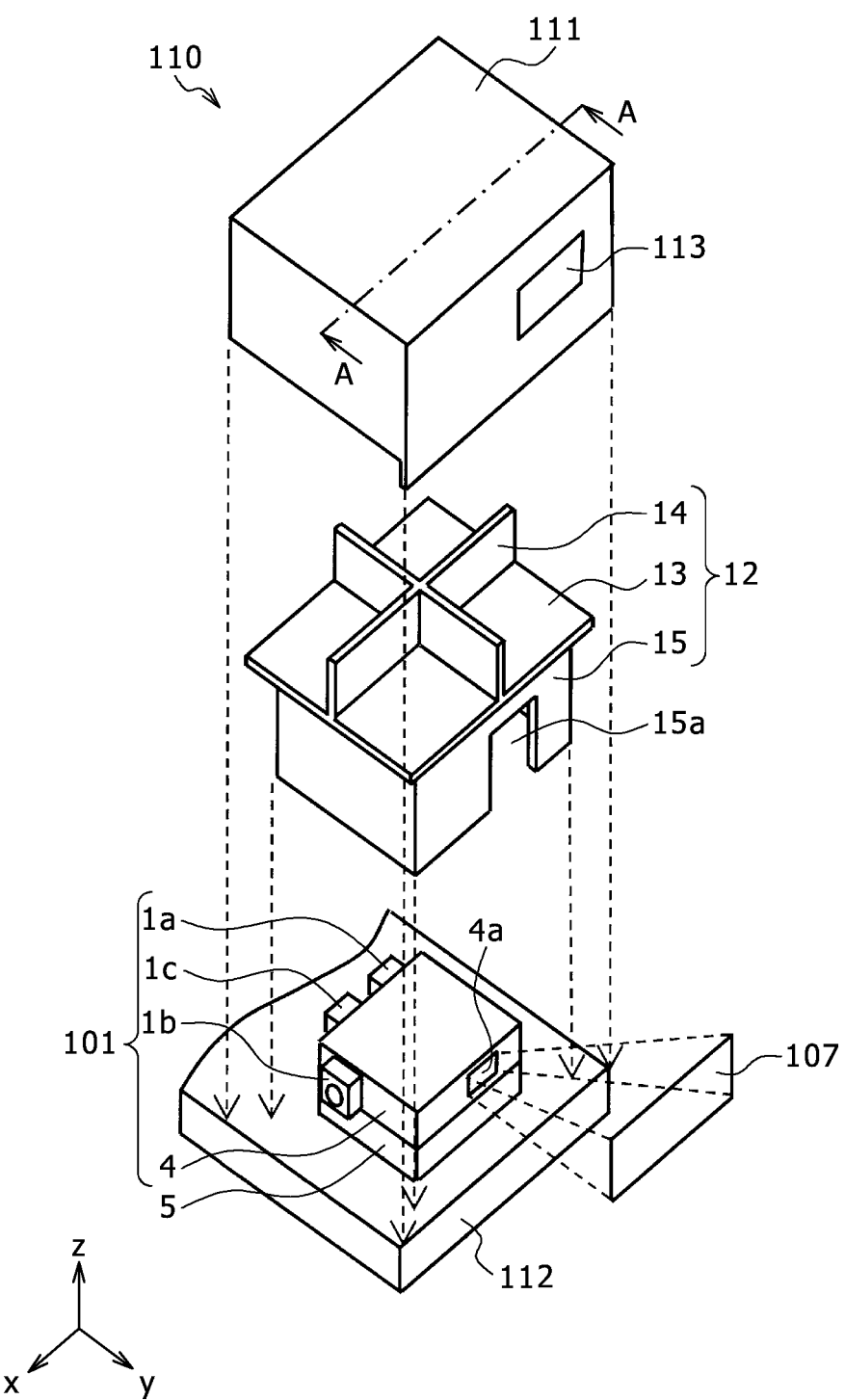
FIG. 3 is an exploded perspective view of a laser light source module according to the first embodiment of the present invention.
Figure 4:
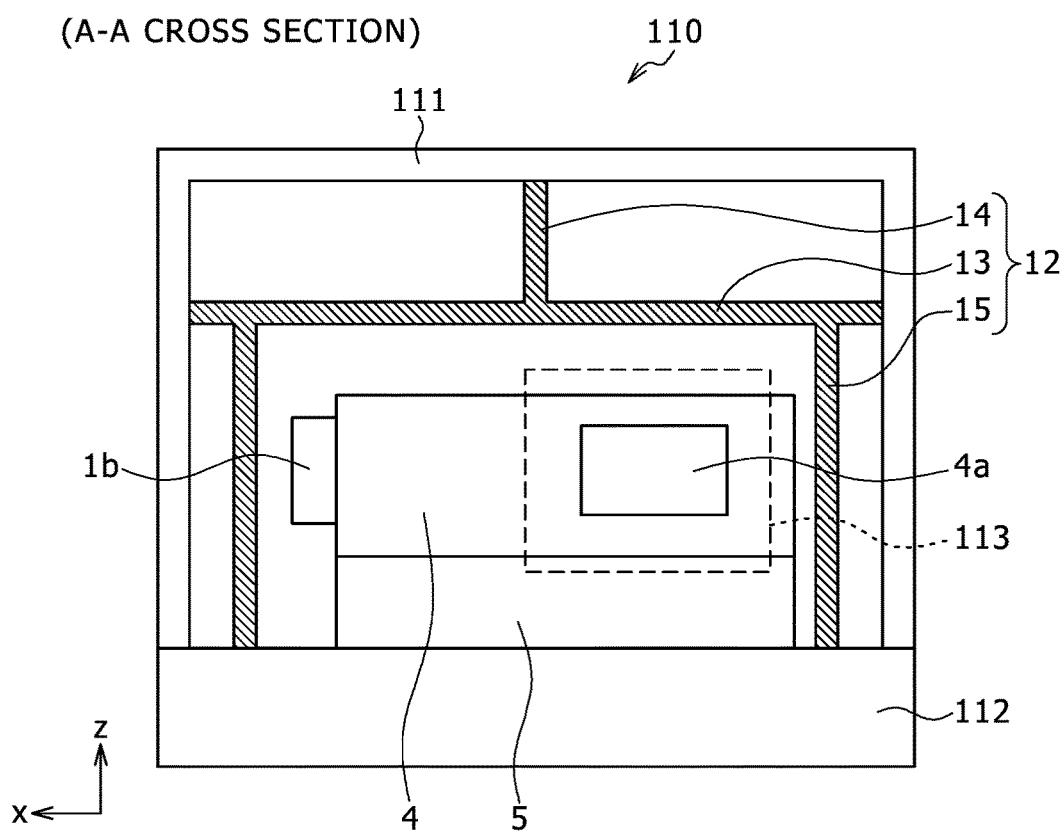
FIG. 4 is a cross-sectional schematic diagram taken along line A-A of the laser light source module illustrated in FIG. 3.

FIG. 3 is an exploded perspective view of the laser light source module 110 according to the first embodiment of the present invention. FIG. 4 is a cross-sectional schematic diagram taken along line A-A of the laser light source module 110 illustrated in FIG. 3. As illustrated in FIGS. 3 and 4, the light source 101 is mounted on the upper face of the base 112 with the temperature adjusting element 5 therebetween, and is doubly covered along its periphery by an inner cover 12 and the outer cover 111. The temperature adjusting element 5 includes a Peltier element, and maintains the temperature of the laser light sources 1a, 1b, and 1c within the operation guarantee temperature range thereof, together with the inner cover 12 and the outer cover 111.

The laser light sources 1a, 1b, and 1c are disposed on the side faces of a holding housing 4 mounted on the temperature adjusting element 5, and emit laser beams to the inside of the holding housing 4. Thus, the collimator lenses 2a, 2b, and 2c, the beam coupling units 3a, 3b, the scanning mirror 108, and the front monitor 109, which are illustrated in FIG. 1, are accommodated inside the holding housing 4, which is not illustrated in FIG. 3. An opening 4a is provided in one side face of the holding housing 4. The opening 4a passes the laser beam emitted from the light source 101 therethrough.

The inner cover 12 is disposed inside the outer cover 111 on the base 112 so as to cover the light source 101 and the temperature adjusting element 5 mounted on the base 112. The inner cover 12 is disposed so as not to directly come into contact with the light source 101 and the temperature adjusting element 5, so that a thermal conductive path is not formed.

Further, as illustrated in FIGS. 3 and 4, the inner cover 12 includes a top plate 13, partitioning grid plates 14, and side plates 15. The top plate 13 has peripheral edges that come into contact with the inner walls of the side portions of the outer cover 111, and divides the inside of the outer cover 111 into upper and lower sections. Thus, the top plate 13 covers the light source 101 from above. The side plates 15 include plate materials extending downward from the top plate 13, the plate materials coming into contact with the base 112, and enclosing and covering the side portions of the light source 101 and the temperature adjusting element 5. In addition, the partitioning grid plates 14 include multiple plate materials that extend upward and substantially vertically from the top plate 13 and come into contact with the inner wall of the upper portion of the outer cover 111, the partitioning grid plates 14 dividing a space between the top plate 13 and the outer cover 111 into multiple spaces (four spaces in the example in FIG. 3).

An opening 15a is provided in the side plate 15 facing the side face provided with the opening 4a of the holding housing 4. The opening 15a passes the laser beam emitted from the light source 101 and power source or controlling wiring therethrough. The rectangle indicated by the dashed line in FIG. 4 represents the position of the laser emission window 113 provided in the outer cover 111.

In this embodiment, the inner cover 12 including the top plate 13, the partitioning grid plates 14, and the side plates 15 is molded of a thermosetting resin having low thermal conductivity. Further, the ends of the peripheral edges of the top plate 13 and the partitioning grid plates 14 are molded into a shape coming into contact with the inner walls of the outer cover 111, and the ends of the peripheral edges of the side plates 15 are molded into a shape coming into contact with the upper face of the base 112.

The inner cover 12 configured as above can reduce the heat transmission and radiation by the convection of air between the light source 101 and the outer cover 111. In addition, since the space upward of the top plate 13 inside the outer cover 111 is divided into multiple small spaces by the partitioning grid plates 14, the flow of air in the mutual space is intercepted to reduce the heat transmission by the convection.

In addition, in this embodiment, the inner cover 12 has a shape that can be easily molded of a thermosetting resin by two molding dies. Thus, it is possible to manufacture the inner cover 12 at low cost. Further, the thus molded inner cover 12 has hardness enough for being carried by a handler. Thus, at assembling the laser light source module 110, there is no workability problem that high accuracy alignment is not enabled.

Figure 5:
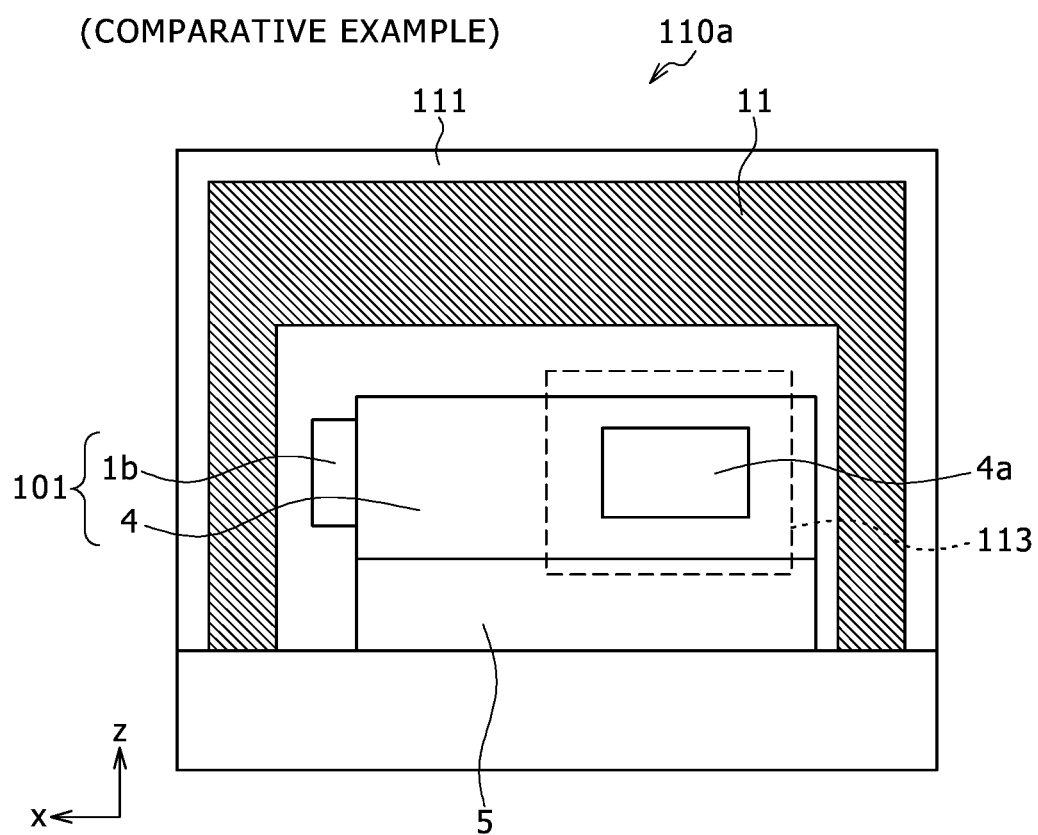
FIG. 5 is a cross-sectional schematic diagram of a laser light source module as a comparative example with respect to the first embodiment of the present invention.

FIG. 5 is a cross-sectional schematic diagram of a laser light source module 110a as a comparative example with respect to the first embodiment of the present invention. In the comparative example illustrated in FIG. 5, a thermal insulation material 11 is provided in the outer cover 111. The thermal insulation material 11 is equivalent to the inner cover 12. Thus, here, the thermal insulation material 11 does not come into contact with the holding housing 4 and the laser light sources 1a, 1b, and 1c of the light source 101, and comes into contact with the inner walls of the outer cover 111.

In the laser light source module 110a having such a structure, according to its assembling procedure, the thermal insulation material 11 is formed on the inner walls of the outer cover 111 to cover the periphery of the light source 101. Thus, the outer cover 111 can be easily carried, thereby improving workability during assembling. However, since the thermal insulation material 11 is soft as described above, sufficient molding accuracy cannot be obtained. Thus, to reliably prevent the thermal insulation material 11 from coming into contact with the light source 101, it is necessary to increase a space between the thermal insulation material 11 and the light source 101.

In that case, it is necessary to reduce the thickness of the thermal insulation material 11 formed inside the outer cover 111 and to increase the space in which the thermal insulation material 11 is not formed. This lowers the thermal insulation effect of the thermal insulation material 11 to increase the heat transmission effect by the convection of air in the space in which the thermal insulation material 11 is not formed.

In the comparative example, since the foam material is used as the thermal insulation material 11, dust is caused from shavings of its end faces during molding. The dust, which floats in the optical path of the laser beam, is displayed as a dark part on the screen 107. In particular, when the thermal insulation material 11 can come into contact with other members, such as the light source 101, wear particles are caused by vibration. Thus, in the comparative example, it is necessary to prevent the dust.

As compared with the comparative example, the laser light source module 110 according to the first embodiment illustrated in FIGS. 3 and 4 employs the thermal insulation structure including the inner cover 12 molded of a thermosetting resin, and can thus have good workability during manufacture, including easy carrying and high accuracy arrangement of the inner cover 12. In addition, in the laser light source module 110, which does not include the thermal insulation material causing dust, no dust can float in the optical path of the laser beam, thereby displaying a clearer image on the screen 107.

Further, in this embodiment, since the space between the outer cover 111 and the top plate 13 is divided into multiple small spaces by the partitioning grid plates 14, the convection of air in the small spaces becomes weaker. Thus, in this embodiment, in particular, the heat transmission effect by the convection becomes lower, thereby improving the thermal insulation effect accordingly. From the evaluation experiment by the present inventors, it is found that the thermal insulation effect of the thermal insulation structure according to this embodiment, that is, the thermal insulation structure including the inner cover 12, is equal to or higher than the thermal insulation effect of the thermal insulation structure including the thermal insulation material 11 illustrated in FIG. 5.

When the thermal insulation effect is improved in this manner, it is easy to prevent the temperature of the laser light sources 1a, 1b, and 1c from varying even when the environment temperature varies greatly. That is, the temperature of the laser light sources 1a, 1b, and 1c is held to the temperature within the operation range thereof. As a result, electric power supplied to the temperature adjusting element 5 can be reduced.

Other embodiments of the present invention will be described with reference to FIGS. 6 to 12. The description of FIGS. 1 to 4 can be substantially directly applied to the embodiments described below, and thus, the differences of the embodiments described below will be mainly described. In the following description of FIGS. 6 to 12, the same components as the first embodiment are indicated by the same reference numerals, and will not be described.

Second Embodiment

Figure 6:
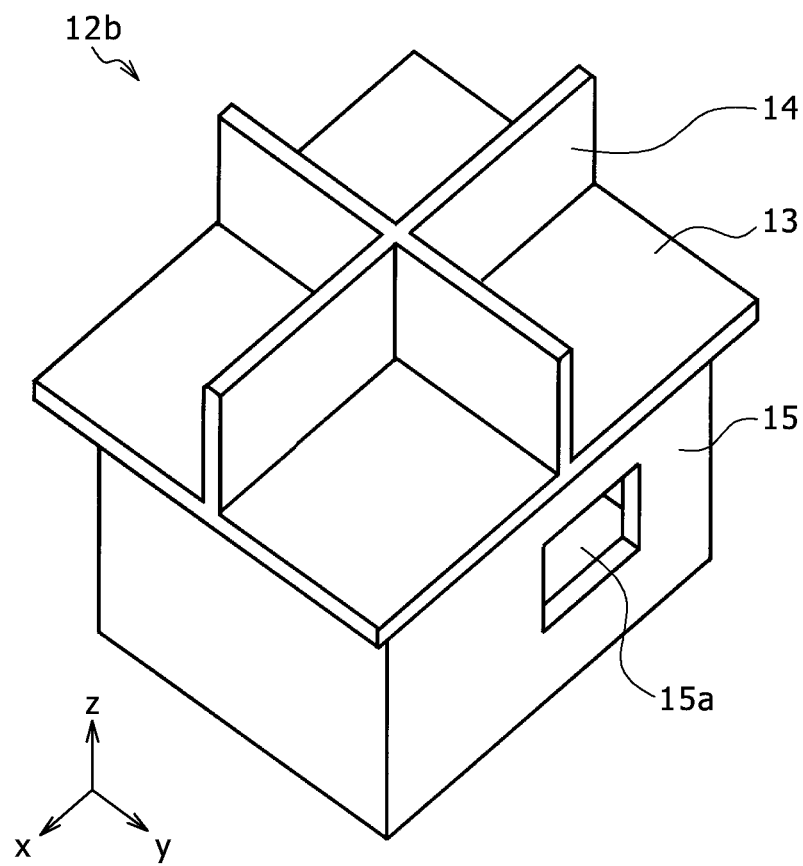
FIG. 6 is an appearance perspective view of an inner cover included in a second embodiment of the present invention.

FIG. 6 is an appearance perspective view of an inner cover 12b included in a second embodiment of the present invention. The inner cover 12b is different from the inner cover 12 of the first embodiment (see FIG. 3) in the shape of the opening 15a formed in the side plate 15. In the first embodiment, the opening 15a is cut from the lower portion of the side plate 15 to have a square shape opened at the lower portion thereof, while in this embodiment, the opening 15a has a square shape closed at the lower portion thereof.

Thus, the inner cover 12 of the first embodiment and the opening 15a can be easily molded by using two molding dies for removing upward and downward. On the contrary, the inner cover 12b of the second embodiment is required to be molded by using two molding dies for removing upward and downward, and then by forming the opening 15a in one side plate 15. This results in increasing the manufacturing cost of the inner cover 12b.

In addition, the opening 15a of this embodiment is smaller than the opening 15a of the first embodiment, thereby reducing the amount of air inside the inner cover 12b that flows from and exits to the outside space with respect to the side plate 15. Thus, the heat transmission by the convection is reduced to improve the thermal insulation effect accordingly. As a result, electric power supplied to the temperature adjusting element 5 can be reduced.

Third Embodiment

Figure 7:
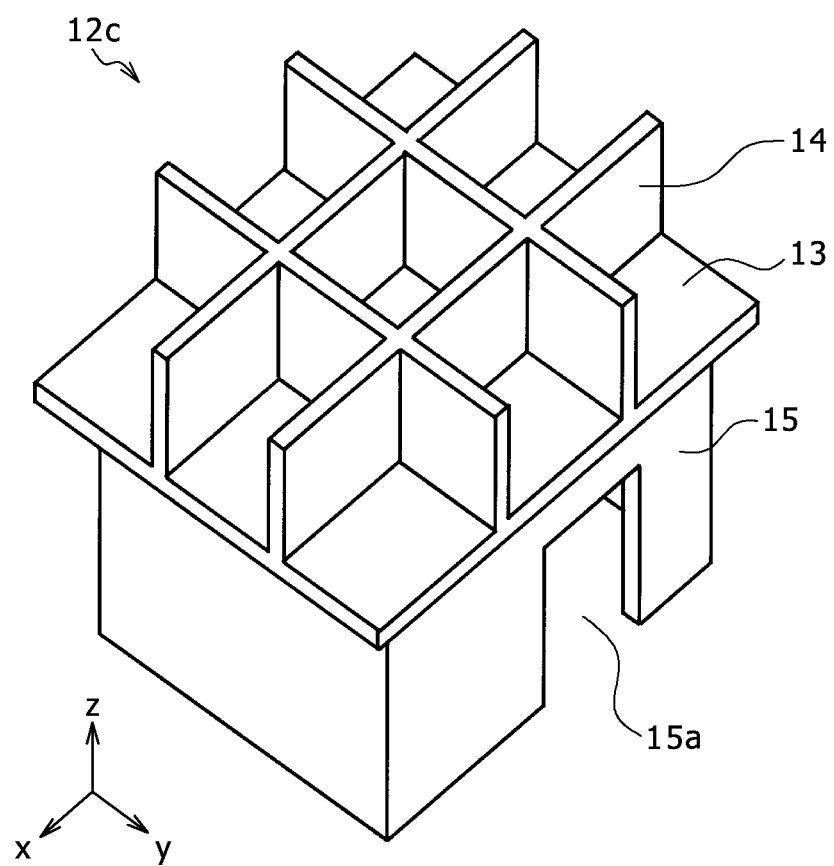
FIG. 7 is an appearance perspective view of an inner cover included in a third embodiment of the present invention.

FIG. 7 is an appearance perspective view of an inner cover 12c included in a third embodiment of the present invention. The inner cover 12c is different from the inner cover 12 of the first embodiment in the number of partition grid plates 14 provided between the top plate 13 and the outer cover 111. That is, in the first embodiment, the space between the top plate 13 and the outer cover 111 is divided into four spaces by two partitioning grid plates 14, while in this embodiment, the space between the top plate 13 and the outer cover 111 is divided into nine spaces by four partitioning grid plates 14.

Thus, in this embodiment, since the space between the outer cover 111 and the top plate 13 is divided into a larger number of spaces than the first embodiment, the spaces being smaller than the first embodiment, the convection of air becomes weaker. Thus, in this embodiment, the heat transmission effect by the convection becomes lower to improve the thermal insulation effect accordingly. As a result, electric power supplied to the temperature adjusting element 5 can be reduced.

Fourth Embodiment

Figure 8:
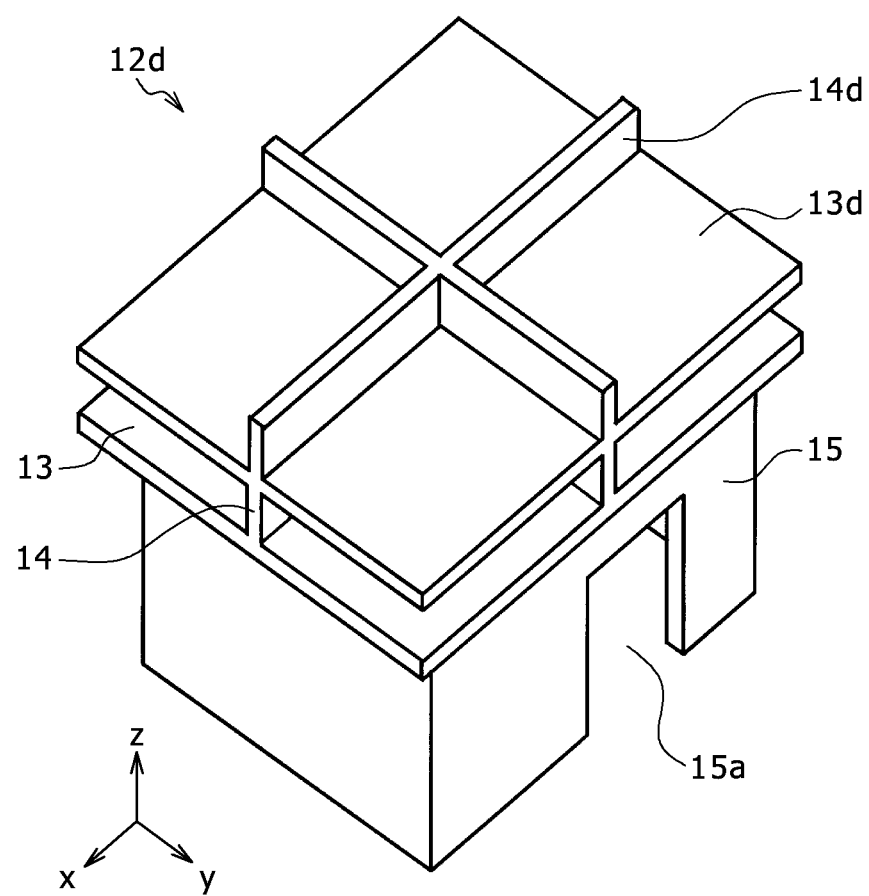
FIG. 8 is an appearance perspective view of an inner cover included in a fourth embodiment of the present invention.

FIG. 8 is an appearance perspective view of an inner cover 12d included in a fourth embodiment of the present invention. The inner cover 12d is different from the inner cover 12 according to the first embodiment in that a second top plate 13d is provided over the top plate 13 and second partitioning grid plates 14d are provided on the partitioning grid plates 14. That is, in this embodiment, the top plate 13 and the partitioning grid plates 14 have a two-story structure.

Thus, as compared with the first embodiment, in this embodiment, the space between the outer cover 111 and the top plate 13 is divided in the vertical direction by the second top plate 13d, so that the convection of air becomes weaker. Thus, in this embodiment, the heat transmission effect by the convection becomes lower to improve the thermal insulation effect accordingly. As a result, electric power supplied to the temperature adjusting element 5 can be reduced.

Fifth Embodiment

Figure 9A:
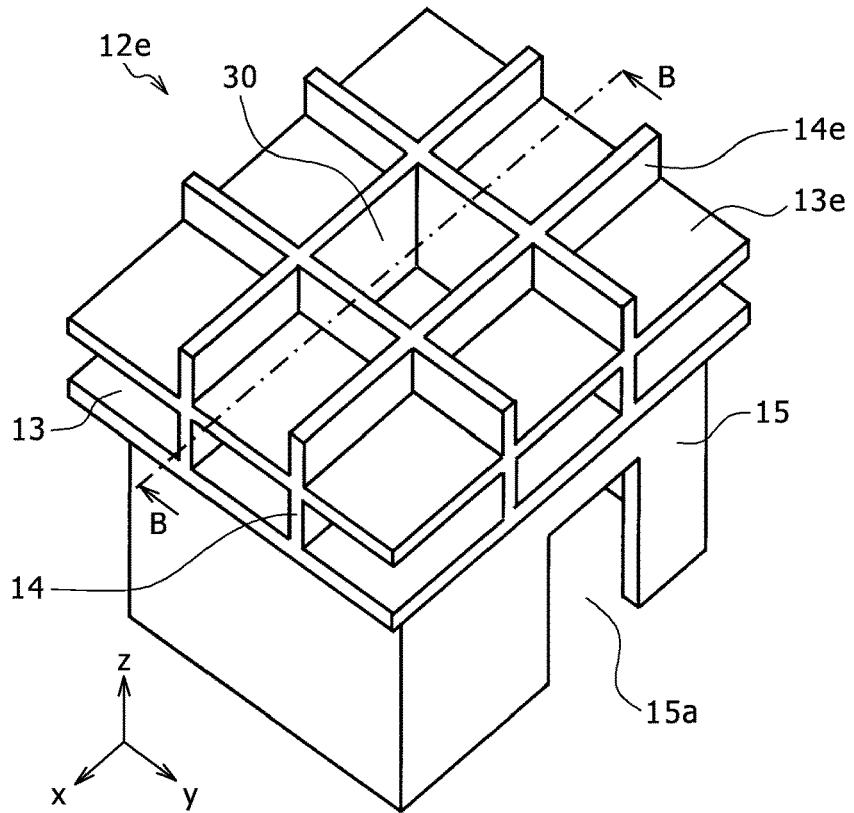
FIG. 9A is an appearance perspective view of an inner cover included in a fifth embodiment of the present invention.
Figure 9B:
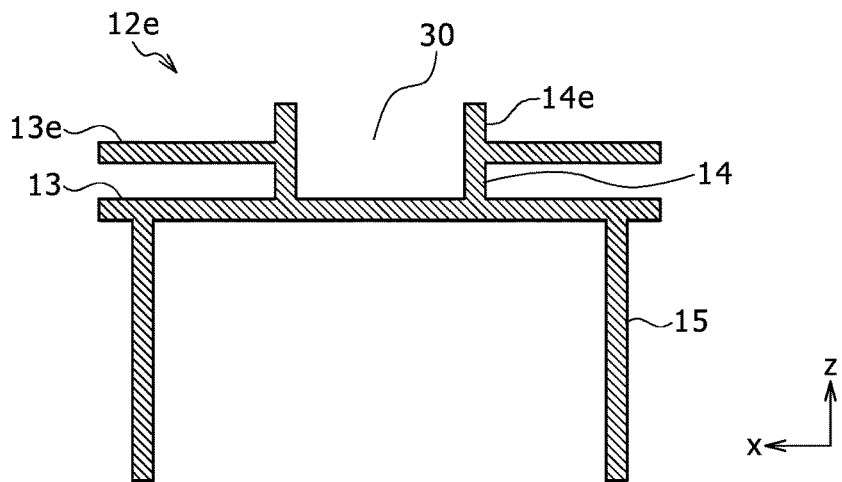
FIG. 9B is a cross-sectional view taken along line B-B.

FIG. 9A is an appearance perspective view of an inner cover 12e included in a fifth embodiment of the present invention, and FIG. 9B is a cross-sectional view taken along line B-B. As with the inner cover 12d according to the fourth embodiment, the inner cover 12e according to this embodiment has a two-story structure in which a second top plate 13e is provided in the upper portion of the top plate 13 and second partitioning grid plates 14e are provided in the upper portions of the partitioning grid plates 14.

In the fourth embodiment, the first floor portion is divided into four sections by the partitioning grid plates 14 and the second floor portion is divided into four sections by the second partitioning grid plates 14d, while in this embodiment, the first floor portion is divided into nine sections by the partitioning grid plates 14 and the second floor portion is divided into nine sections by the second partitioning grid plates 14e. In this embodiment, the portion corresponding to the floor of a center section 30 from among the nine sections of the second floor portion is not formed with the second top plate 13e, and provides one space, that is, one open ceiling space, between the sections of the first floor portion and the second floor portion.

When the top plate 13e is provided in the portion corresponding to the floor of the second story of the center section 30, it is necessary to divide the inner cover 12e into two components during molding. In that case, the product assembling process is increased by one extra step, resulting in increasing the product manufacturing cost. Thus, in this embodiment, without forming the second top plate 13e in the center section 30, the inner cover 12e can be molded as one component. Further, when two molding dies for releasing rightward and leftward are combined with two molding dies for releasing upward and downward, the inner cover 12e illustrated in FIG. 9A can be molded as one component.

As compared with the inner cover 12c according to the third embodiment, in the inner cover 12e according to this embodiment, the space between the top plate 13 and the outer cover 111 is subdivided by the second top plate 13e and the second partitioning grid plates 14e, the convection of air becomes even weaker. Thus, in this embodiment, the heat transmission effect by the convection becomes even lower to improve the thermal insulation effect accordingly. As a result, more of electric power supplied to the temperature adjusting element 5 can be reduced.

To obtain the same effect as the above effect, the inner cover 12e may be provided with the top plate 13e in the portion corresponding to the floor of the second story of the center section 30. However, in that case, as described above, it is necessary to divide the inner cover 12e into two components during molding, resulting in increasing the manufacturing cost.

Sixth Embodiment

Figure 10:
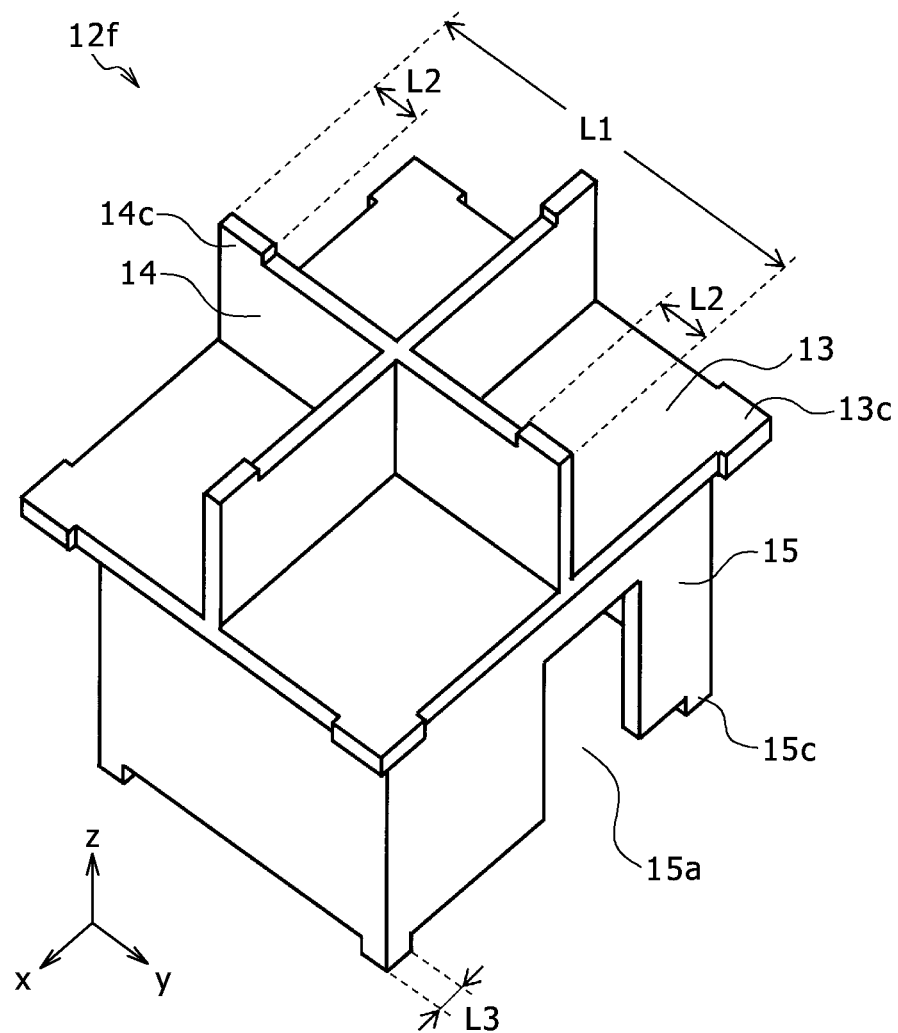
FIG. 10 is an appearance perspective view of an inner cover included in a sixth embodiment of the present invention.

FIG. 10 is an appearance perspective view of an inner cover 12f included in a sixth embodiment of the present invention. The inner cover 12f is different from the inner cover 12 according to the first embodiment in the shape of the portions of the top plate 13 and the partitioning grid plates 14 that come into contact with the outer cover 111 and in the shape of the portions of the side plates 15 that comes into contact with the base 112.

That is, in the inner cover 12 according to the first embodiment, the peripheral edges of the top plate 13 and the partitioning grid plates 14 entirely come into contact with the outer cover 111, and the peripheral edges of the side plates 15 entirely come into contact with the base 112. On the contrary, in this embodiment, convex contact portions 13c are provided at both ends of each side of the top plate 13 that come into contact with the inner wall of each side portion of the outer cover 111. Convex contact portions 15c are provided at both ends of each side of each side plate 15 that come into contact with the upper face of the base 112. Convex contact portions 14c are provided at both ends of each side of the plate material of each partitioning grid plate 14 that come into contact with the inner wall of the upper portion of the outer cover 111.

Thus, the area of the portions of the inner cover 12f according to this embodiment that come into contact with the outer cover 111 and the base 112 is smaller than the area of the portions of the inner cover 12 that come into contact with the outer cover 111 and the base 112. In this embodiment, the portion of the top plate 13 in which the convex contact portions 13c are not provided comes into contact with the outer cover 111 via an air layer, the portion of the partitioning grid plate 14 in which the convex contact portions 14c are not provided comes into contact with the outer cover 111 via an air layer, and the portion of the side plate 15 in which the convex contact portions 15c are not provided comes into contact with the base 112 via an air layer.

Even when the inner covers 12, 12f are molded of a thermosetting resin having low thermal conductivity, the thermal conductivity thereof is higher than the thermal conductivity of air. Thus, in this embodiment, the heat transmission effect by thermal conduction between the inner cover 12f and the outer cover 111 can be reduced. It can thus be expected that the thermal insulation effect of this embodiment is higher than the thermal insulation effect of the first embodiment. As a result, electric power supplied to the temperature adjusting element 5 can be reduced.

In the above description, the convex contact portions 13c are provided at both ends of the peripheral edge of the top plate 13, the convex contact portions 14c are provided at both ends of the peripheral edge of the partitioning grid plate 14, and the convex contact portions 15c are provided at both ends of the peripheral edge of the side plate 15. However, the convex contact portions 13c, 14c, and 15c may be located in any position as far as possible from the laser light sources 1a, 1b, and 1c. This is based on the idea in which when the thermal resistances of the portions near the laser light sources 1a, 1b, and 1c are relatively increased, heat can be distributed to portions far therefrom, thereby reducing the influence of heat received from the inner cover 12f on the laser light sources 1a, 1b, and 1c.

The description so far has not reflected the effect of the convection (including radiation in this case, which is the same hereinafter) generated in the air layer in the gap between the portion of the top plate 13 in which the contact portions 13c are not provided and the outer cover 111, and in the air layer in the gap between the portion of the partitioning grid plate 14 in which the contact portions 14c are not provided and the outer cover 111, and in the air layer in the gap between the portion of the side plate 15 in which the contact portions 15c are not provided and the base 112. The heat transmission effect by the convection will be described below with reference to FIG. 11.

Figure 11:
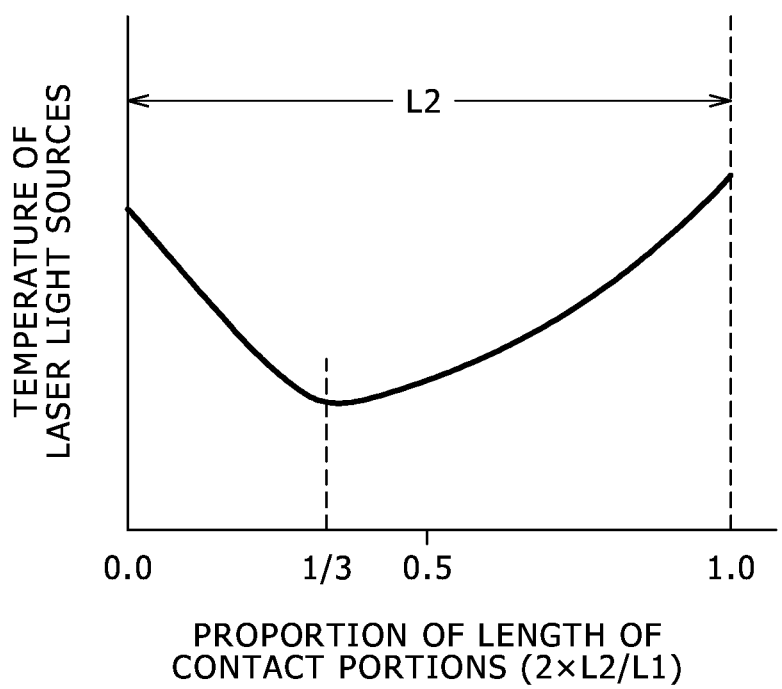
FIG. 11 is a graph of experiment results obtained by evaluating the relationship between the proportion of the length of contact portions in the inner cover included in the sixth embodiment of the present invention and the temperature of laser light sources.

FIG. 11 is a graph of experiment results obtained by evaluating the relationship between the proportion of the length of the contact portions in the inner cover 12f included in the sixth embodiment of the present invention and the temperature of the laser light sources. In FIG. 11, the horizontal axis of the graph represents the proportion of the length of the contact portions, and the vertical axis of the graph represents the temperature of the laser light sources. As easily seen from the graph, the temperature of the laser light sources depends on the proportion of the length of the contact portions, with the optimum value of the proportion of the length of the contact portions minimizing the temperature of the laser light sources.

The proportion of the length of the contact portions of e.g., the partitioning grid plate 14 (see FIG. 10) is determined as the value of $2 \times L2/L1$ when L1 is the length of the portion of the partitioning grid plate 14 that comes into contact with the inner wall of the outer cover 111 (in this case, including the portion of the partitioning grid plate 14 that comes into contact with the inner wall of the outer cover 111 via the gap of the air layer), and $2 \times L2$ is the length of two contact portions 14c provided in the partitioning grid plate 14. The proportion of the length of the contact portions is determined for the top plate 13 and the side plate 15 in the same manner.

The proportion of the length of the contact portions in FIG. 11 is the proportion of the total length of the contact portions 13c provided in the top plate 13 with respect to the total length of the portion of the top plate 13 that comes into contact with the outer cover 111 (including the portion of the top plate 13 that comes into contact with the outer cover 111 via the gap of the air layer), the proportion of the total length of the contact portions 14c provided in the partitioning grid plate 14 with respect to the total length of the portion of the partitioning grid plate 14 that comes into contact with the outer cover 111 (including the portion of the partitioning grid plate 14 that comes into contact with the outer cover 111 via the gap of the air layer), and the proportion of the total length of the contact portions 15c provided in the side plate 15 with respect to the total length of the portion of the side plate 15 that comes into contact with the base 112 (including the portion of the side plate 15 that comes into contact with the base 112 via the gap of the air layer).

The temperature of the laser light sources is obtained by measuring the temperature near the laser light sources 1a, 1b, and 1c when electric power supplied to the temperature adjusting element 5 is constant in a high-temperature environment. When the thermal insulation effect of the inner cover 12f is high, the temperature of the laser light sources becomes lower, while when the thermal insulation effect of the inner cover 12f is low, the temperature of the laser light sources becomes higher. Thus, in the graph in FIG. 11, as the proportion of the length of the contact portions is increased in the range of approximately 0 to $\frac{1}{3}$, the thermal insulation effect becomes higher, while as the proportion of the length of the contact portions is increased in the range of approximately $\frac{1}{3}$ to 1, the thermal insulation effect becomes lower.

That is, when the proportion of the length of the contact portions is below approximately $\frac{1}{3}$, the area of the gap portion between the inner cover 12f and the outer cover 111 is increased, thereby increasing the amount of heat transmission by the convection of air. As a result, as the proportion of the length of the contact portions is decreased, the thermal insulation effect becomes lower. On the contrary, when the proportion of the length of the contact portions is above approximately $\frac{1}{3}$, the length of the contact part between the inner cover 12f and the outer cover 111 is increased, thereby increasing the amount of heat transmission by thermal conduction in the contact part. As a result, as the proportion of the length of the contact portions is increased, the thermal insulation effect becomes lower.

As described above, in this embodiment, when the proportion of the length of the contact portions is approximately $\frac{1}{3}$, the highest thermal insulation effect can be obtained. When two contact portions 13c are provided at the side of each peripheral edge of the top plate 13 that comes into contact with the outer cover 111, the length of each contact portion 13c is approximately ⅙ of the length of the side of the peripheral edge of the top plate 13 that comes into contact with the outer cover 111. When two contact portions 14c are provided at the side of each peripheral edge of the partitioning grid plate 14 that comes into contact with the outer cover 111, the length of each contact portion 14c is approximately ⅙ of the length of the side of the peripheral edge of the partitioning grid plate 14 that comes into contact with the outer cover 111. When two contact portions 15c are provided at the side of each peripheral edge of the side plate 15 that comes into contact with the base 112, the length of each contact portion 15c is approximately ⅙ of the length of the side of the peripheral edge of the side plate 15 that comes into contact with the base 112. This is preferable for maximizing the thermal insulation effect.

The length of the contact portion 13c provided in the top plate 13, the length of the contact portion 14c provided in the partitioning grid plate 14, and the length of the contact portion 15c provided in the side plate 15 may be equal. However, it is preferable that in the contact portions 13c, 14c, and 15c, length L2 of the contact portion 14c that is provided in the upper portion of the partitioning grid plate 14 and comes into contact with the inner wall of the upper portion of the outer cover 111 (see FIG. 10) be longer than length L3 of the contact portion 15c that is provided in the lower portion of the side plate 15 and comes into contact with the upper face of the base 112 (see FIG. 10), that is, L2>L3. This is for improving the thermal insulation effect based on the idea in which inside the outer cover 111 and the inner cover 12f, the pressure is higher on the upper portion side thereof by the convection of air, and the pressure is lower on the lower portion side thereof, so that the heat transmission effect by the convection becomes higher on the upper portion side thereof, and the heat transmission effect by the convection becomes lower on the lower portion side thereof.

That is, by increasing length L2 of the contact portion 14c provided in the upper portion of the partitioning grid plate 14 and by decreasing length L3 of the contact portion 15c provided in the lower portion of the side plate 15, the contact area via the air layer in the portion in which the heat transmission effect by the convection is high is decreased, and the contact area via the air layer in the portion in which the heat transmission effect by the convection is low is increased. Thus, from such balancing, the amount of heat transmission by the convection can be reduced to improve thermal insulation performance.

In the description of the sixth embodiment, the convex contact portions 13c, 14c, and 15c provided in the inner cover 12f have a rectangular parallelepiped shape, but may have a triangular projection shape or a spherical projection shape. When the convex contact portions 13c, 14c, and 15c have a triangular projection shape, the contact area of the contact portions 13c, 14c, and 15c can be reduced. This can prevent both of the heat transmission by contact and the convection via the air layer to enable effective thermal insulation.

In addition, the convex contact portions 13c, 14c, and 15c provided in the inner cover 12f may be molded of a material and shape that can be pressed into the inner walls of the outer cover 111. In that case, in the assembling process of the scanning image display apparatus 100, the inner cover 12f can be pressed, positioned, and fixed into the outer cover 111. As a result, a mounting member, such as an adhesive, is not required, thereby improving production efficiency.

Seventh Embodiment

Figure 12:
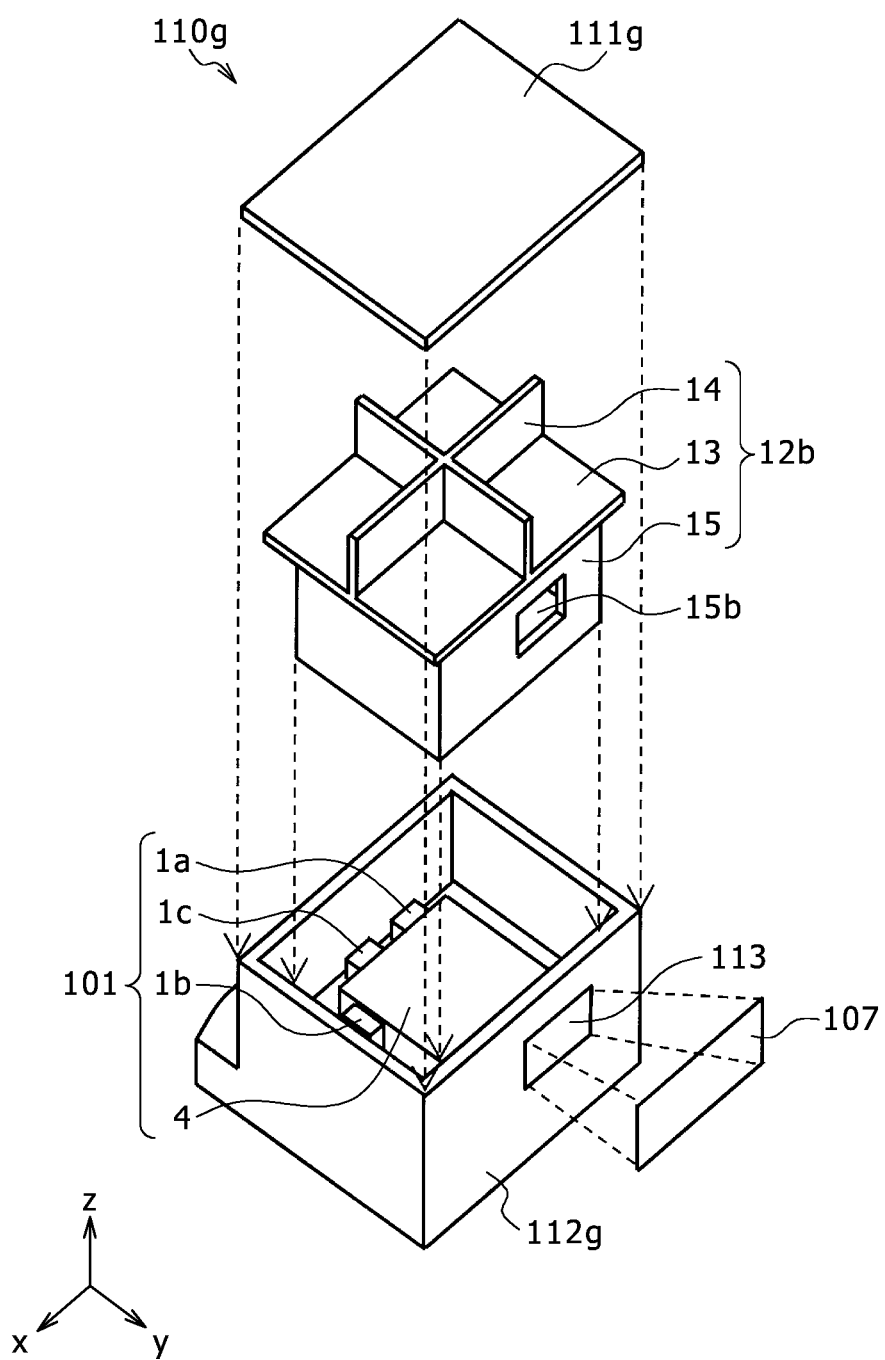
FIG. 12 is an exploded perspective view of a laser light source module according to a seventh embodiment of the present invention.

FIG. 12 is an exploded perspective view of a laser light source module 110g according to a seventh embodiment of the present invention. The laser light source module 110g according to this embodiment is different from the laser light source module 110 according to the first embodiment (see FIG. 3) in the shapes of an outer cover 111g and a base 112g. That is, in this embodiment, the outer cover 111g includes only a top plate, and does not have side plates that cover the side faces of the inner cover 12b. Instead, the inner cover 12b is accommodated in a square tubular portion that extends from the base portion of the base 112g to the upper portion thereof, and covers the light source 101 mounted on the base portion of the base 112g with the temperature adjusting element 5 (not illustrated in FIG. 12) therebetween.

In the laser light source module 110g having the above structure, the outer cover 111g can have a simple plate shape. Thus, in the assembling process of the laser light source module 110g, the light source 101 and the inner cover 12 are mounted in the tubular portion of the base 112g, and the plate-shaped outer cover 111g is then mounted from above. Thus, the assembling process is simplified. In this embodiment, needless to say, the same effect as the first embodiment can be obtained.

The present invention is not limited to the above embodiments, and includes various modifications. For example, in the first to seventh embodiments, the space between the side plate 15 of each side portion of the inner cover 12 and the outer cover 111 (the tubular portion of the base 112g in the seventh embodiment) is not divided into multiple spaces, but may be divided into multiple spaces by using members similar to the partitioning grid plates 14.

In addition, the above embodiments have been described in detail for clearly understandably describing the present invention, and do not always include all the above structures. Further, part of the structure of one of the embodiments can be replaced with part of the structure of the other embodiments. Furthermore, the structure of one of the embodiments can be added with part or all of the structure of the other embodiments.

EXPLANATION OF REFERENCE LETTER 1a, 1b, 1c laser light source
2a, 2b, 2c collimator lens
3a, 3b beam coupling unit
4 holding housing
4a opening
5 temperature adjusting element
11 thermal insulation material
12, 12b, 12c, 12d, 12e, 12f inner cover
13, 13d, 13e top plate
14, 14d, 14e partitioning grid plate (partitioning plate)
15 side plate
13c, 14c, 15c convex contact portion
15a opening
100 scanning image display apparatus
110, 110a, 110g laser light source module
120 control module
101 light source
102 control circuit
103 video signal processing circuit 104 laser light source drive circuit
105 scanning mirror drive circuit
106 front monitor signal detection circuit
107 screen
109 front monitor
111, 111g outer cover
112, 112g base
113 laser emission window
114 protective cover
115 heat sink
120 control module

The invention claimed is:

1. A laser light source module comprising:
a light source emitting a laser beam;
a base on which the light source is mounted;
an outer cover disposed on the base so as to cover the light source mounted on the base, the outer cover including an inner top wall; and
an inner cover disposed between the light source and the outer cover and covering the light source,
wherein the inner cover has a first top plate, and a plurality of partitioning grid plates that extend from the first top plate, the partitioning grid plates dividing a space between the inner cover and the outer cover into a plurality of spaces,
wherein the partitioning grid plates each have a plurality of convex contact portions that contact the inner top wall of the outer cover, and
wherein a total length of the convex contact portions of each respective partitioning grid plate in contact with the inner top wall is approximately one-third of a length of the respective partitioning grid plate.

2. The laser light source module according to claim 1,
wherein the outer cover includes a plurality of inner side walls,
wherein the first top plate has a plurality of convex contact portions that contact the inner side walls of the outer cover,
wherein the convex contact portions of the first top plate are disposed at peripheral edges of the first top plate and are in contact with the inner side walls of the outer cover, and the first top plate divides the space between the inner cover and the outer cover into upper and lower sections, the first top plate covering the light source from above,
wherein the inner cover further includes a plurality of side plates that extend downward from the first top plate and are in contact with the base, the side plates covering sides of the light source, and
wherein the partitioning grid plates extend upward from the first top plate, the partitioning grid plates dividing the upper section of the space between the first top plate and the outer cover into the plurality of spaces.

3. The laser light source module according to claim 2,
wherein the inner cover includes a second top plate that divides one or more of the spaces, between the first top plate and the outer cover divided by the partitioning grid plates, further into upper and lower sections.

4. The laser light source module according to claim 2,
wherein the side plates each have a plurality of convex contact portions that contact the base.

5. The laser light source module according to claim 2,
wherein a total length of the convex contact portions of the first top plate in contact with one of the inner side walls is approximately one-third of a length of a respective side of the first top plate.

6. The laser light source module according to claim 4,
wherein the convex contact portions of the partitioning grid plates are larger than the convex contact portions of the side plates.

7. A scanning image display apparatus comprising:
a laser light source module that includes a light source emitting a laser beam; and
a control module that includes a video signal processing circuit that processes an image signal inputted from the outside, and a scanning mirror drive circuit that drives a scanning mirror for deflecting the laser beam,
wherein the laser light source module includes:
a base on which the light source is mounted,
an outer cover disposed on the base so as to cover the light source mounted on the base, the outer cover including an inner top wall, and
an inner cover disposed between the light source and the outer cover and covering the light source,
wherein the inner cover has a first top plate, and a plurality of partitioning grid plates that extend from the first top plate, the partitioning grid plates dividing a space between the inner cover and the outer cover into a plurality of spaces,
wherein the first top plate and the partitioning grid plates each have a plurality of convex contact portions that contact the inner top wall and inner sidewalls of the outer cover, and
wherein a total length of the convex contact portions of each respective partitioning grid plate in contact with the inner top wall is approximately one-third of a length of the respective partitioning grid plate.

8. The scanning image display apparatus according to claim 7,
wherein the outer cover includes a plurality of inner side walls,
wherein the convex contact portions of the first top plate are disposed at peripheral edges of the first top plate and are in contact with the inner side walls of the outer cover, and the first top plate divides the space between the inner cover and the outer cover into upper and lower sections, the first top plate covering the light source from above,
wherein the inner cover further includes a plurality of side plates that extend downward from the first top plate and are in contact with the base, the side plates covering sides of the light source, and
wherein the partitioning grid plates extend upward from the first top plate, the partitioning grid plates dividing the upper section of the space between the first top plate and the outer cover into the plurality of spaces.

9. The scanning image display apparatus according to claim 8,
wherein the inner cover includes a second top plate that divides one or more of the spaces, between the first top plate and the outer cover divided by the partitioning grid plates, further into upper and lower sections.

10. A laser light source module comprising:
a light source emitting a laser beam;
a base on which the light source is mounted;
an outer cover disposed on the base so as to cover the light source mounted on the base, the outer cover including an inner top wall and a plurality of inner side walls; and
an inner cover disposed between the light source and the outer cover and covering the light source,
wherein the inner cover has a first top plate and a plurality of partitioning grid plates that extend from the first top plate, the partitioning grid plates dividing a space between the inner cover and the outer cover into a plurality of spaces, wherein the first top plate has a plurality of convex contact portions that contact inner side walls of the outer cover, and wherein a total length of the convex contact portions of the first top plate in contact with one of the inner side walls is approximately one-third of a length of a respective side of the first top plate.

11. The laser light source module according to claim 10, wherein the partitioning grid plates each have a plurality of convex contact portions that contact the inner top wall of the outer cover, wherein the convex contact portions of the first top plate are disposed at peripheral edges of the first top plate and are in contact with the inner side walls of the outer cover, and the first top plate divides the space between the inner cover and the outer cover into upper and lower sections, the first top plate covering the light source from above, wherein the inner cover further includes a plurality of side plates that extend downward from the first top plate and are in contact with the base, the side plates covering sides of the light source, and wherein the partitioning grid plates extend upward from the first top plate, the partitioning grid plates dividing the upper section of the space between the first top plate and the outer cover into the plurality of spaces.

12. The laser light source module according to claim 11, wherein the inner cover includes a second top plate that divides one or more of the spaces between the first top plate and the outer cover divided by the partitioning grid plates, further into upper and lower sections.

13. The laser light source module according to claim 11, wherein the side plates each have a plurality of convex contact portions that contact the base.

14. The laser light source module according to claim 11, wherein a total length of the convex contact portions of each of the respective partitioning grid plates in contact with the inner top wall is approximately one-third of a length of the respective partitioning grid plate.

15. The laser light source module according to claim 13, wherein the convex contact portions of the partitioning grid plates are larger than the convex contact portions of the side plates.

* * * * *